US010155378B2

(12) United States Patent
Kawamoto

(10) Patent No.: US 10,155,378 B2
(45) Date of Patent: Dec. 18, 2018

(54) FULL-BRIDGE CIRCUIT, LIQUID JET HEAD, AND LIQUID JET RECORDING DEVICE

(71) Applicant: SII Printek Inc., Chiba-shi, Chiba (JP)

(72) Inventor: Shunji Kawamoto, Chiba (JP)

(73) Assignee: SII PRINTEK INC., Chiba (JP)

( * ) Notice: Subject to any disclaimer, the term of this patent is extended or adjusted under 35 U.S.C. 154(b) by 0 days.

(21) Appl. No.: 15/711,799

(22) Filed: Sep. 21, 2017

(65) Prior Publication Data

US 2018/0093474 A1 Apr. 5, 2018

(30) Foreign Application Priority Data

Oct. 3, 2016 (JP) .................................. 2016-195367

(51) Int. Cl.
B41J 2/045 (2006.01)
H03K 3/01 (2006.01)
H03K 19/20 (2006.01)
H03K 17/66 (2006.01)
H03K 17/687 (2006.01)

(52) U.S. Cl.
CPC ......... B41J 2/04541 (2013.01); B41J 2/0455 (2013.01); B41J 2/04581 (2013.01); B41J 2/04588 (2013.01); H03K 3/01 (2013.01); B41J 2202/10 (2013.01); H03K 17/664 (2013.01); H03K 17/6874 (2013.01); H03K 19/20 (2013.01)

(58) Field of Classification Search
CPC .. B41J 2/04541; B41J 2/0455; B41J 2/04548; B41J 2/0457; H02M 1/08; H03K 17/66; H01L 2924/00; G09G 2310/0289
See application file for complete search history.

(56) References Cited

U.S. PATENT DOCUMENTS 8,009,452 B1 * 8/2011 Sadwick ............... H02M 3/335
363/149
2011/0018355 A1 * 1/2011 Yoshino ............... B41J 2/04541
307/85

FOREIGN PATENT DOCUMENTS

JP 2016-165120 A 9/2016

* cited by examiner

Primary Examiner — Jason Uhlenhake
(74) Attorney, Agent, or Firm — Brinks Gilson & Lione

(57) ABSTRACT

An overvoltage is prevented from being applied to a circuit. A full-bridge circuit is provided with a first switch having an output terminal connected to one end of a capacitive load, and switching output to the output terminal between a power supply and a ground, a second switch having an output terminal connected to the other end of the capacitive load, and switching output to the output terminal between the power supply and the ground, a first waveform generation section adapted to output a drive waveform for driving the first switch, a second waveform generation section adapted to output a drive waveform for driving the second switch, a detection section adapted to detect voltages of the drive waveforms output by the first waveform generation section and the second waveform generation section, and a control section adapted to control the output of either of the switches based on the voltages detected by the detection section.

14 Claims, 12 Drawing Sheets

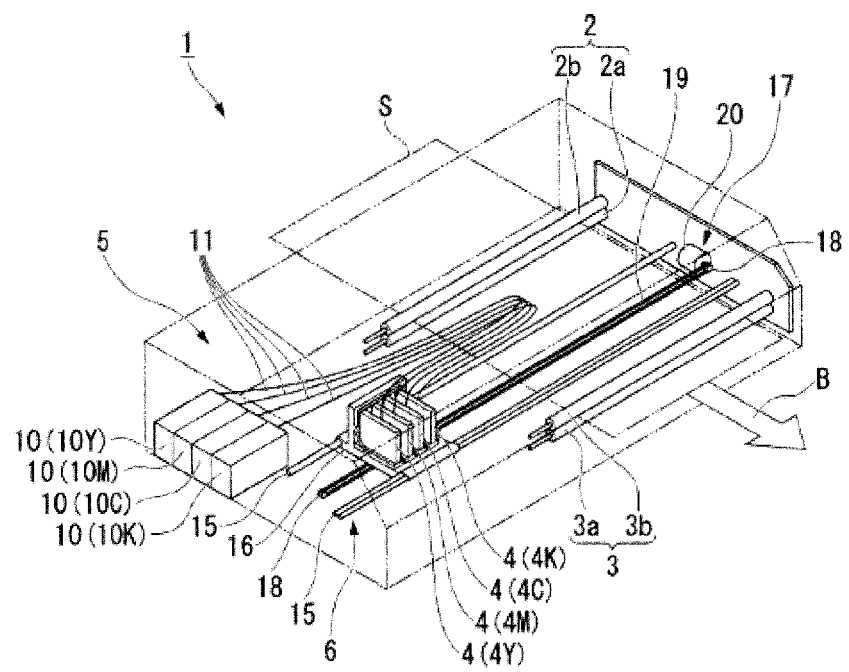
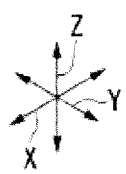
FIG. 1

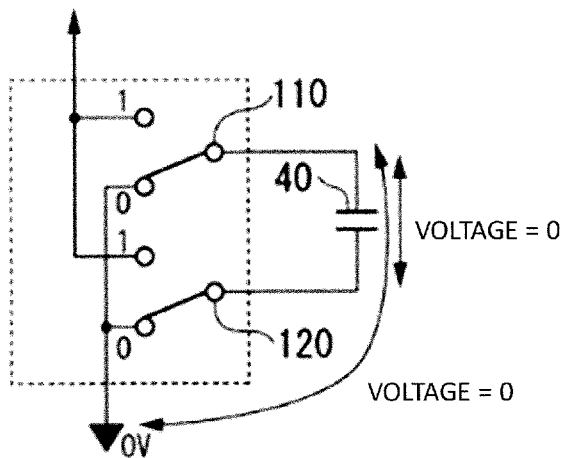
FIG. 6A [INITIAL STATE]
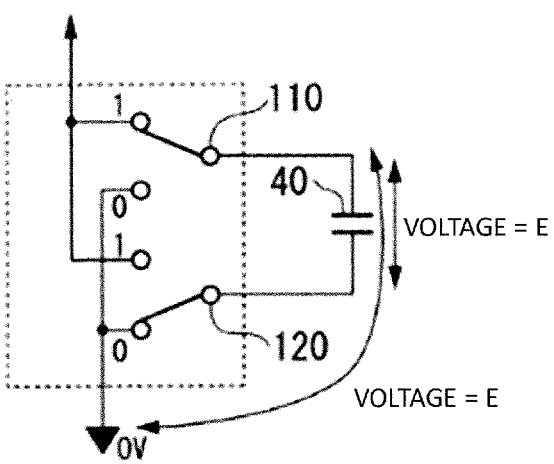
FIG. 6B [CHARGING]

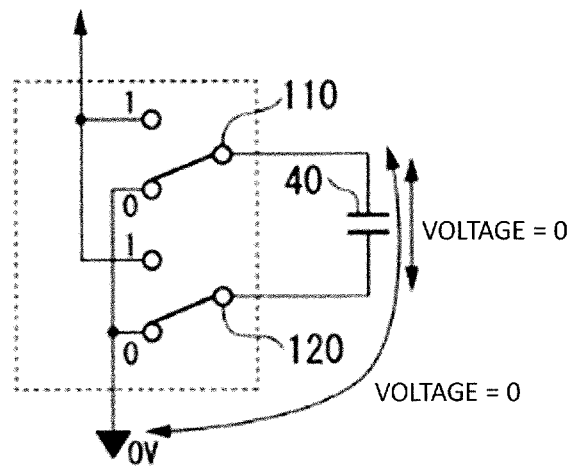
FIG. 6C [INITIAL STATE]
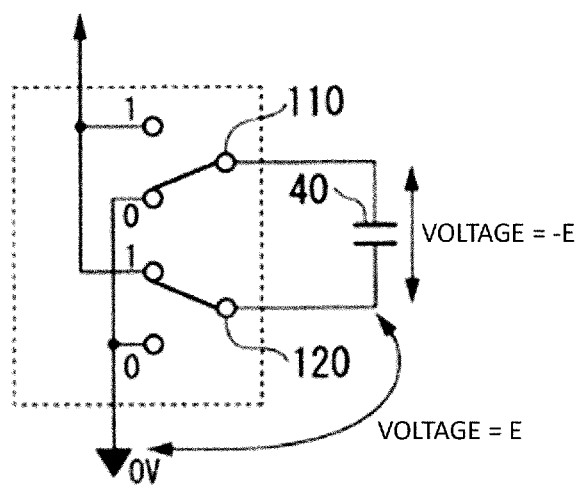
FIG. 6D [REVERSE CHARGING]

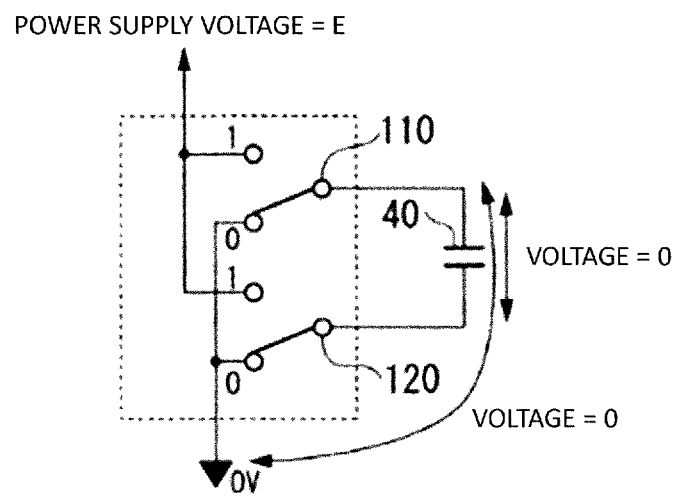
FIG. 6E [DISCHARGING]

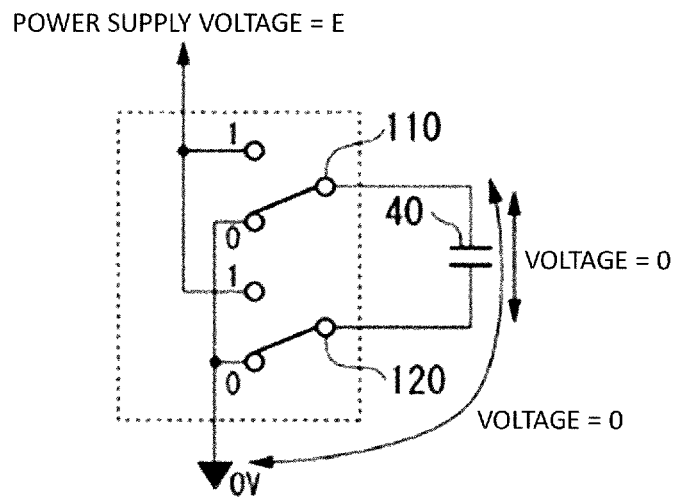
FIG. 7A [DISCHARGING STATE]
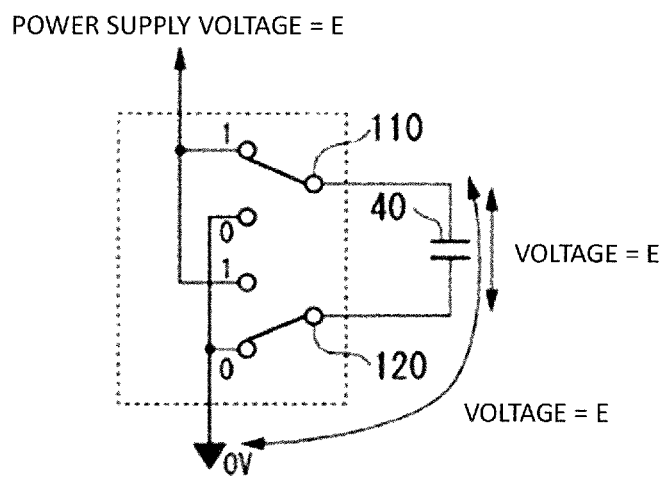
FIG. 7B [CHARGING]

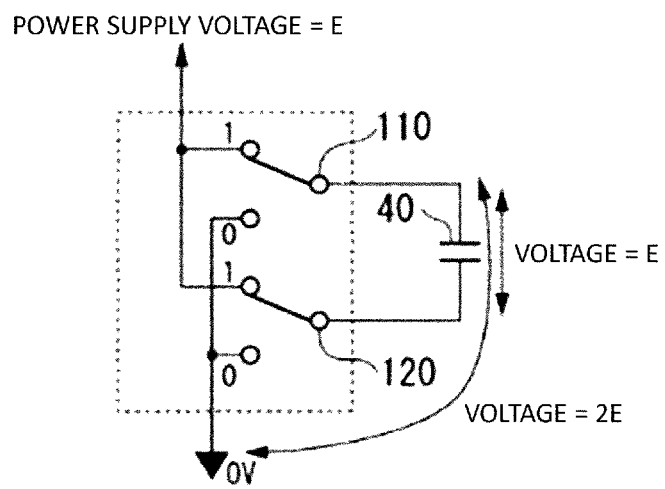
FIG. 7C [ADDITIONAL CHARGING]

FULL-BRIDGE CIRCUIT, LIQUID JET HEAD, AND LIQUID JET RECORDING DEVICE

RELATED APPLICATIONS

This application claims priority under 35 U.S.C. § 119 to Japanese Patent Application No. 2016-195367 filed on Oct. 3, 2016, the entire content of which is hereby incorporated by reference.

BACKGROUND OF THE INVENTION

Field of the Invention

The present invention relates to a full-bridge circuit, a liquid jet head, and a liquid jet recording device.

Background Art

In a driver IC (Integrated Circuit), in the case of driving a capacitive load with a full-bridge circuit, the circuit becomes to constitute a charge pump as a whole (see, e.g., JP-A-2016-165120 (PTL 1)).

However, in the technology described in PTL 1, since the circuit constitutes the charge pump as a whole, there is a problem that such a voltage as to exceed the absolute maximum rating of a drive circuit occurs depending on the driving timing so as to make the drive circuit break down in some cases.

SUMMARY OF THE INVENTION

The present invention has been made taking the circumstances described above into consideration, and has an object of providing a full-bridge circuit, a liquid jet head, and a liquid jet recording device each capable of preventing an excessively high voltage from being applied to a circuit.

According to an aspect of the invention, there is provided a full-bridge circuit including a first switch having an output terminal connected to one end of a capacitive load, and switching output to the output terminal between a power supply and a ground, a second switch having an output terminal connected to the other end of the capacitive load, and switching output to the output terminal between the power supply and the ground, a first waveform generation section adapted to output a drive waveform for driving the first switch, a second waveform generation section adapted to output a drive waveform for driving the second switch, a detection section adapted to detect voltages of the drive waveforms output by the first waveform generation section and the second waveform generation section, and a control section adapted to control the output of either of the first switch or the second switch based on the voltages detected by the detection section.

Further, according to another aspect of the invention, in the full-bridge circuit described above, the control section controls the output of either of the first switch or the second switch to be at the ground based on the voltages detected by the detection section.

Further, according to another aspect of the invention, in the full-bridge circuit described above, the first switch switches the output to the output terminal to the power supply in a case in which the voltage of the drive waveform output by the first waveform generation section is in a high level, and switches the output to the output terminal to the ground in a case in which the voltage of the drive waveform output by the first waveform generation section is in a low level, the second switch switches the output to the output terminal to the power supply in a case in which the voltage of the drive waveform output by the second waveform generation section is in the high level, and switches the output to the output terminal to the ground in a case in which the voltage of the drive waveform output by the second waveform generation section is in the low level, and the control section controls the output of the second switch to be at the ground in a case in which the detection section has detected that the voltage of the drive waveform output by the first waveform generation section is in the high level and that the voltage of the drive waveform output by the second waveform generation section has been switched from the low level to the high level.

Further, according to another aspect of the invention, in the full-bridge circuit described above, the control section controls the output of the second switch to be at the ground in a case in which the detection section has detected that the voltage of the drive waveform output by the second waveform generation section has been switched from the low level to the high level before time period of equal to or longer than an electrical discharge time constant of the capacitive load elapses from when the voltage of the drive waveform output by the first waveform generation section has been switched from the high level to the low level.

Further, according to another aspect of the invention, in the full-bridge circuit described above, there is further included an AND circuit adapted to fix the voltage of the drive waveform output by the second waveform generation section to the low level, a control signal from the control section is input to a first input terminal of the AND circuit, and the control section controls the output of the second switch to be at the ground by controlling the control signal to be the low level.

Further, according to another aspect of the invention, in the full-bridge circuit described above, the control section controls the output of either of the first switch or the second switch to be at the power supply based on the voltages detected by the detection section.

Further, according to another aspect of the invention, in the full-bridge circuit described above, the first switch switches the output to the output terminal to the power supply in a case in which the voltage of the drive waveform output by the first waveform generation section is in a high level, and switches the output to the output terminal to the ground in a case in which the voltage of the drive waveform output by the first waveform generation section is in a low level, the second switch switches the output to the output terminal to the power supply in a case in which the voltage of the drive waveform output by the second waveform generation section is in the high level, and switches the output to the output terminal to the ground in a case in which the voltage of the drive waveform output by the second waveform generation section is in the low level, and the control section controls the output of the second switch to be at the power supply in a case in which the detection section has detected that the voltage of the drive waveform output by the first waveform generation section is in the low level and that the voltage of the drive waveform output by the second waveform generation section has been switched from the high level to the low level.

Further, according to another aspect of the invention, in the full-bridge circuit described above, the control section controls the output of the second switch to be at the power supply in a case in which the detection section has detected that the voltage of the drive waveform output by the second waveform generation section has been switched from the high level to the low level before time period of equal to or longer than an electrical discharge time constant of the capacitive load elapses from when the voltage of the drive waveform output by the first waveform generation section has been switched from the low level to the high level.

Further, according to another aspect of the invention, in the full-bridge circuit described above, there is further included an OR circuit adapted to fix the voltage of the drive waveform output by the second waveform generation section to the power supply, a control signal from the control section is input to a first input terminal of the OR circuit, and the control section controls the output of the second switch to be at the power supply by controlling the control signal to be the high level.

Further, according to another aspect of the invention, in the full-bridge circuit described above, the control section controls the output of the first switch or the second switch which has been controlled so as to be held until a predetermined condition is fulfilled, and releases the control of the output thereof when the predetermined condition is fulfilled.

Further, according to another aspect of the invention, there is provided a liquid jet head including any one of the full-bridge circuits described above, and an actuator plate which is the capacitive load driven by the full-bridge circuit.

Further, according to another aspect of the invention, there is provided a liquid jet recording device including the liquid jet head described above.

According to the present invention, it is possible to prevent an overvoltage from being applied to a circuit.

BRIEF DESCRIPTION OF THE DRAWINGS

FIG. 1 is a perspective view showing a configuration of a liquid jet recording device according to an embodiment of the invention.

FIGS. 6A through 6E are diagrams showing an example of a normal drive pattern of a first switch and a second switch in the embodiment of the invention.

FIGS. 7A through 7C are diagrams showing an example of an abnormal drive pattern of the first switch and the second switch in the embodiment of the invention.

Figure 2:
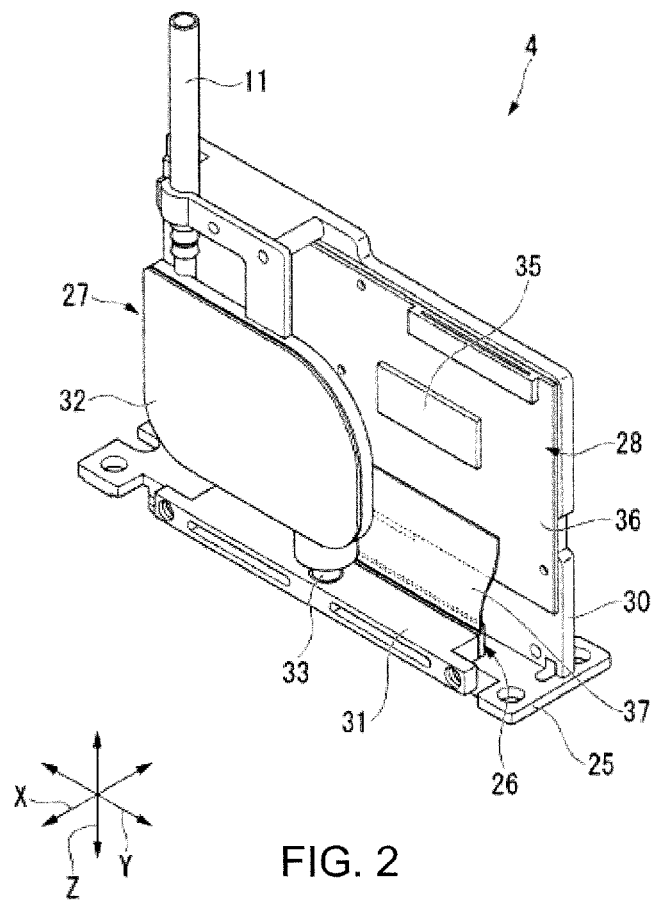
FIG. 2 is a perspective view of a liquid jet head according to the embodiment of the invention.

DETAILED DESCRIPTION OF THE INVENTION (Liquid Jet Recording Device)

Hereinafter, an embodiment of the invention will be described with reference to the drawings.

Firstly, a schematic configuration of a liquid jet recording device 1 according to the present embodiment will be described.

FIG. 1 is a perspective view showing a configuration of the liquid jet recording device 1. It should be noted that in the drawings described below, the scale size of each member is arbitrarily altered so as to make the explanation easy to understand.

As shown in the drawing, the liquid jet recording device 1 is provided with a pair of conveyers 2, 3 for conveying a recording target medium S such as recording paper, liquid jet heads 4 for ejecting ink not shown to the recording target medium S, an ink supply unit 5 for supplying the liquid jet head 4 with the ink, and a scanner 6 for making the liquid jet head 4 carry out a scanning operation in a scanning direction X perpendicular to a conveying direction Y of the recording target medium S.

It should be noted that in the present embodiment, the direction perpendicular to the two directions, namely the conveying direction Y and the scanning direction X, is defined as a vertical direction Z.

The pair of conveyers 2, 3 are disposed with a distance in the conveying direction Y, and specifically, the conveyer 2, one of the pair of conveyers, is located on the upstream side in the conveying direction Y, and the conveyer 3, the other of the pair of conveyers, is located on the downstream side in the conveying direction Y. These conveyers 2, 3 are provided with grit rollers 2a, 3a each extending in the scanning direction X, pinch rollers 2b, 3b arranged in parallel to the grit rollers 2a, 3a and for pinching the recording target medium S with the grit rollers 2a, 3a, and a drive mechanism not shown such as a motor for rotating the grit rollers 2a, 3a around the respective axes.

Further, by rotating the grit rollers 2a, 3a of the pair of conveyers 2, 3, it is possible to convey the recording target medium S in the direction of the arrow B along the conveying direction Y.

The ink supply unit 5 is provided with ink tanks 10 each housing the ink, and ink pipes 11 for respectively connecting the ink tanks 10 and the liquid jet heads 4 to each other.

In the example shown in the drawing, as the ink tanks 10, the ink tanks 10Y, 10M, 10C, and 10K respectively housing the ink of four colors of yellow (Y), magenta (M), cyan (C), and black (K) are arranged along the conveying direction Y. The ink pipes 11 are each, for example, a flexible hose having flexibility, and are made capable of following the action (movement) of the carriage 16 for supporting the liquid jet heads 4.

The scanner 6 is provided with a pair of guide rails 15, the carriage 16, and a drive mechanism 17, wherein the pair of guide rails 15 extend in the scanning direction X, and are disposed in parallel to each other with a distance in the conveying direction Y, the carriage 16 is disposed so as to be movable along the pair of guide rails 15, and the drive mechanism 17 moves the carriage 16 in the scanning direction X.

The drive mechanism 17 is provided with a pair of pulleys 18, an endless belt 19, and a drive motor 20, wherein the pair of pulleys 18 are disposed between the pair of guide rails 15 with a distance in the scanning direction X, the endless belt 19 is wound between the pair of pulleys 18, and moves in the scanning direction X, and the drive motor 20 rotationally drives one of the pulleys 18.

The carriage 16 is connected to the endless belt 19, and is made movable in the scanning direction X in accordance with the movement of the endless belt 19 due to the rotational drive of the one of the pulleys 18. Further, on the carriage 16, there is mounted the plurality of liquid jet heads 4 in the state of being arranged in the scanning direction X.

In the example shown in the drawing, there are mounted the four liquid jet heads 4, namely the liquid jet heads 4Y, 4M, 4C, and 4K, for respectively ejecting the ink of four colors of yellow (Y), magenta (M), cyan (C), and black (K).
(Liquid Jet Head)

Then, the liquid jet heads 4 will be described in detail.

FIG. 2 is a perspective view of the liquid jet head 4.

As shown in the drawing, the liquid jet head 4 is provided with a fixation plate 25, a head chip 26, an ink supply section 27, and a controller 28, wherein the fixation plate 25 is fixed to the carriage 16, and the head chip 26 is fixed on the fixation plate 25, the ink supply section 27 further supplies an ink introduction hole 41*a* described later of the head chip 26 with the ink having been supplied from the ink supply unit 5, and the controller 28 applies a drive voltage to the head chip 26.

The liquid jet heads 4 eject the ink of the respective colors with predetermined jet amounts in response to the application of the drive voltages. On this occasion, by the scanner 6 moving the liquid jet heads 4 in the scanning direction X, it is possible to carry out recording in a predetermined range on the recording target medium S. By repeatedly carrying out the scanning operation while conveying the recording target medium S in the conveying direction Y by conveyers 2, 3, it becomes possible to carry out recording in the entire area of the recording target medium S.

To the fixation plate 25, there are fixed a base plate 30 made of metal such as aluminum in a state of standing along the vertical direction Z, and a flow channel member 31 for supplying the ink to the ink introduction hole 41*a* described later of the head chip 26. Above the flow channel member 31, there is disposed a pressure damper 32 having a reservoir chamber for reserving the ink inside in a state of being supported by the base plate 30. Further, the flow channel member 31 and the pressure damper 32 are connected to each other via an ink connection pipe 33, and to the pressure damper 32, there is connected the ink pipe 11.

In such a configuration, when the ink is supplied via the ink pipe 11, the pressure damper 32 once reserves the ink in the reservoir chamber located inside the pressure damper 32, and then supplies a predetermined amount of the ink to the ink introduction hole 41*a* via the ink connection pipe 33 and the flow channel member 31.

It should be noted that the flow channel member 31, the pressure damper 32, and the ink connection pipe 33 function as the ink supply section 27 described above.

Further, to the fixation plate 25, there is attached an IC board 36 on which a control circuit (a drive circuit) 35 such as an integrated circuit for driving the head chip 26. The control circuit 35, and a common electrode (a drive electrode) and an individual electrode described later (both not shown) of the head chip 26 are electrically connected to each other via a flexible board 37 having a wiring pattern not shown printed as wiring. Thus, it becomes possible for the control circuit 35 to apply the drive voltage between the common electrode and the individual electrode via the flexible board 37.

It should be noted that the IC board 36, on which the control circuit 35 is mounted, and the flexible board 37 function as the controller 28 described above.
(Head Chip)

Next, the details of the head chip 26 will be described.

Figure 3:
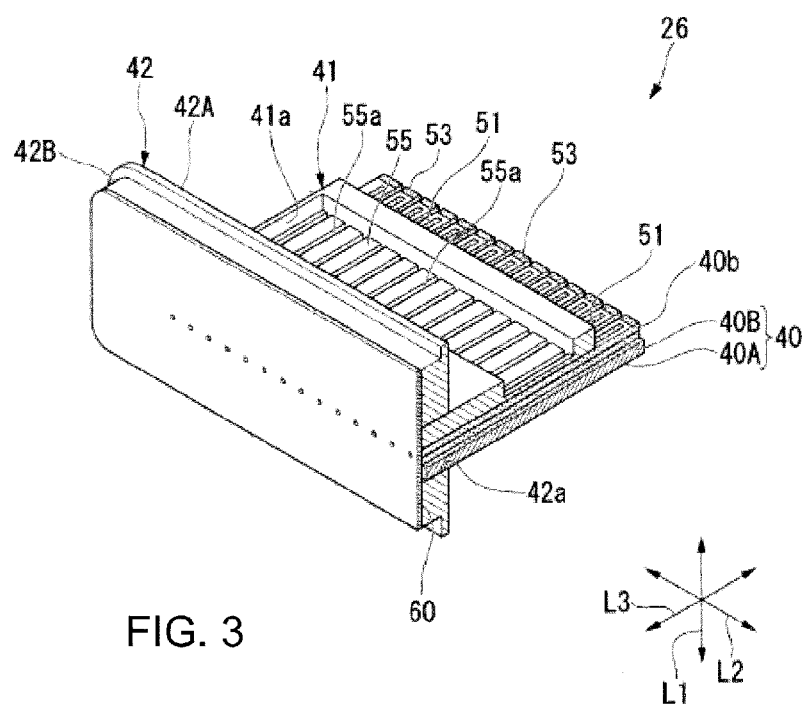
FIG. 3 is a perspective view of a head chip in the embodiment of the invention.
Figure 4:
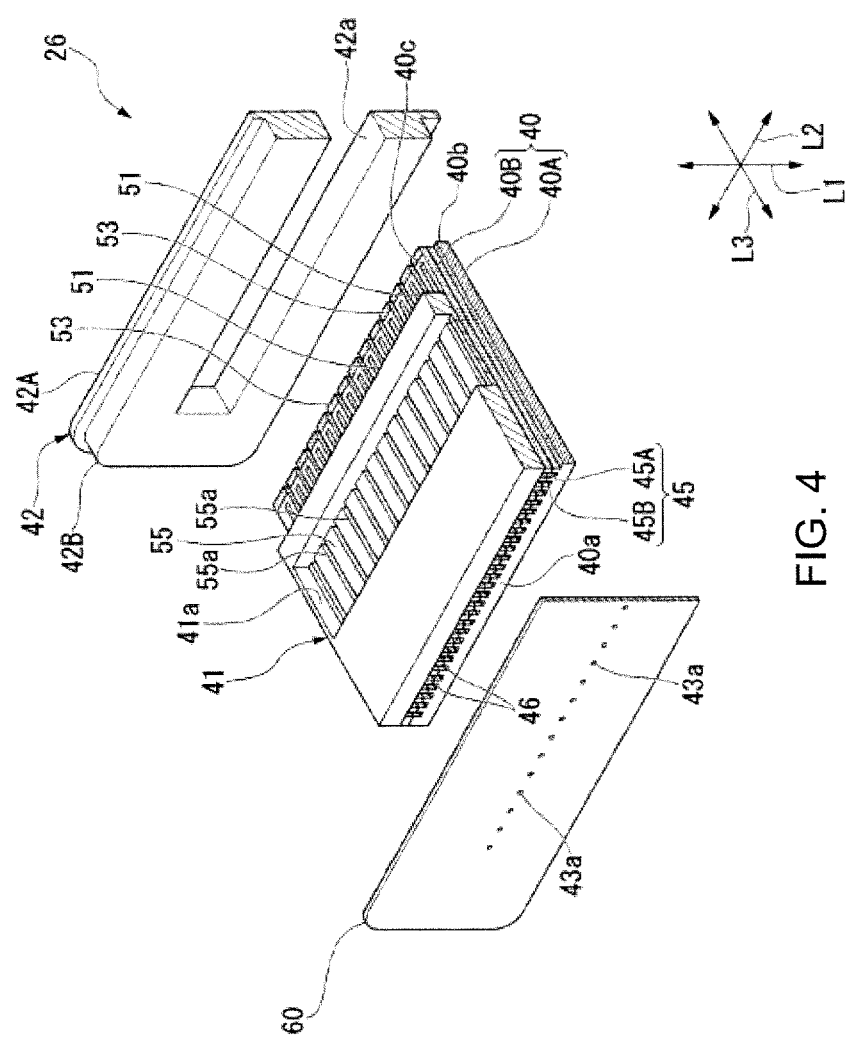
FIG. 4 is an exploded perspective view of the head chip in the embodiment of the invention.

FIG. 3 is a perspective view of the head chip 26, and FIG. 4 is an exploded perspective view of the head chip 26.

As shown in FIG. 3 and FIG. 4, the head chip 26 is provided with an actuator plate 40, a cover plate 41, a support plate 42, and a nozzle plate 60, wherein the nozzle plate 60 is disposed on a side surface of the actuator plate 40.

The head chip 26 is made as a so-called edge-shoot type for ejecting the ink from the nozzle holes 43*a* opening at the end part in the longitudinal direction of the liquid ejection channel 45A described later.

The actuator plate 40 is made as a so-called laminated plate having two plates, namely a first actuator plate 40A and a second actuator plate 40B, stacked on one another. It should be noted that the actuator plate 40 can also be formed of a single plate besides the laminated plate.

The first actuator plate 40A and the second actuator plate 40B are both a piezoelectric substrate such as a PZT (lead zirconate titanate) ceramics substrate on which a polarization treatment has been carried out in the thickness direction, and are bonded to each other in the state in which the respective polarization directions are opposite to each other.

The actuator plate 40 is formed to have a roughly rectangular planar shape longer in a first direction (an arrangement direction) L2 perpendicular to the thickness direction L1 and shorter in a second direction L3 perpendicular to the thickness direction L1 and the first direction L2.

It should be noted that since the head chip 26 of the present embodiment is the edge-shoot type, the thickness direction L1 coincides with the scanning direction X in the liquid jet recording device 1, and at the same time, the first direction L2 coincides with the conveying direction Y, and the second direction L3 coincides with the vertical direction Z. Specifically, for example, out of the side surfaces of the actuator plate 40, the side surface (a side surface on the side from which the ink is ejected) opposed to the nozzle plate 60 becomes a lower end surface 40*a*, and a side surface located on the opposite side in the second direction L3 to the lower end surface 40*a* becomes an upper end surface 40*b*. In the following description, the description is presented with the simple references of "lower side" and "upper side" in some cases based on the upper and lower directions described here. However, normally, it goes without saying that the upper and lower directions vary in accordance with the installation angle of the liquid jet recording device 1.

On one principal surface (a surface overlapped by the cover plate 41) 40*c* of the actuator plate 40, there is formed a plurality of channels 45 arranged in the first direction L2 with predetermined distances. The channels 45 are each a groove linearly extending along the second direction L3 in the state of opening on one principal surface 40*c* side, and one side in the longitudinal direction of each of the channels 45 opens on the lower end surface 40*a* side of the actuator plate 40. Between these channels 45, there are formed drive walls (piezoelectric division walls) 46 each having a roughly rectangular cross-sectional shape and extending in the second direction L3. The channels 45 are partitioned by the drive walls 46.

Further, the plurality of channels 45 are roughly divided into liquid ejection channels 45A filled with the ink, and non-ejection channels 45B not filled with the ink. Further, the liquid ejection channels 45A and the non-ejection channels 45B are arranged alternately in the first direction L2.

Among these channels, the liquid ejection channels 45A are each formed in the state of opening only on the lower end surface 40*a* side of the actuator plate 40 without opening on the upper end surface 40*b* side. In contrast, the non-ejection channels 45B are each formed so as to open not only on the lower end surface 40*a* side of the actuator plate 40, but also on the upper end surface 40*b* side.

On inner wall surfaces, namely a pair of sidewall surfaces opposed to each other in the first direction L2, and the bottom wall surface of each of the liquid ejection channels 45A, there is formed the common electrode not shown. The common electrode extends in the second direction L3 along the liquid ejection channel 45A, and is electrically connected to a common terminal 51 formed on the one principal surface 40c of the actuator plate 40.

In contrast, among inner wall surfaces of the non-ejection channels 45B, on a pair of sidewall surfaces opposed to each other in the first direction L2, there are respectively formed the individual electrodes not shown. These individual electrodes extend in the second direction L3 along the non-ejection channel 45B, and are electrically connected respectively to individual terminals 53 formed on the one principal surface 40c of the actuator plate 40.

It should be noted that the individual terminals 53 are formed on the upper end surface 40b side of the common terminal 51 on the one principal surface 40c of the actuator plate 40. Further, the individual electrodes (the individual electrodes respectively formed in the non-ejection channels 45B different from each other) respectively located on both sides across the liquid ejection channel 45A are formed so as to be connected to each other.

In such a configuration, when the control circuit 35 applies the drive voltage between the common electrode and the individual electrode via the flexible board 37 and further through the common terminal 51 and the individual terminal 53, the drive walls 46 are deformed. Then, a pressure variation occurs in the ink with which the liquid ejection channel 45A is filled. Thus, it is possible to eject the ink in the liquid ejection channel 45A from the nozzle hole 43a, and it become possible to record a variety of types of information such as characters or figures on the recording target medium S.

On the one principal surface 40c of the actuator plate 40, there is overlapped the cover plate 41. In the cover plate 41, there is formed the ink introduction hole 41a having a roughly rectangular planar shape elongated in the first direction L2.

In the ink introduction hole 41a, there is formed an ink introduction plate 55 provided with a plurality of slits 55a for introducing the ink supplied via the flow channel member 31 into the liquid ejection channels 45A and at the same time restricting the introduction of the ink into the non-ejection channels 45B. Specifically, the slits 55a are formed at positions corresponding respectively to the liquid ejection channels 45A, and it becomes possible to fill only the liquid ejection channels 45A with the ink.

It should be noted that the cover plate 41 is formed of, for example, a PZT ceramics substrate, which is the same material as that of the actuator plate 40, to thereby achieve the same thermal expansion as that of the actuator plate 40, and thus the warpage and the deformation due to the change in temperature are prevented. It should be noted that the invention is not limited to this case, but it is also possible to form the cover plate 41 with a material different from that of the actuator plate 40. In this case, it is preferable to use a material close in thermal expansion coefficient to the actuator plate 40 as the material of the cover plate 41.

The support plate 42 supports the actuator plate 40 and the cover plate 41 overlapped with each other, and at the same time supports the nozzle plate 60. The support plate 42 is a plate member having a roughly rectangular shape elongated in the first direction L2 so as to correspond to the actuator plate 40, and is provided with a fitting hole 42a penetrating in the thickness direction formed in most of the central portion. The fitting hole 42a is formed along the first direction L2 so as to have a roughly rectangular shape, and supports the actuator plate 40 and the cover plate 41 overlapped with each other in the state of fitting in the fitting hole 42a.

Further, the support plate 42 is formed to have a stepped plate shape so that the outer shape of the support plate 42 decreases downward in the thickness direction due to the step. In other words, the support plate 42 is obtained by integrally molding a base part 42A located on the upper end side in the thickness direction, and a step part 42B disposed on the lower end surface of the base part 42A and formed to have a smaller outer shape than that of the base part 42A. Further, the support plate 42 is combined so that the end surface of the step part 42B is coplanar with the lower end surface 40a of the actuator plate 40. Further, to the end surface of the step part 42B, there is fixed the nozzle plate 60 with, for example, an adhesive.

(Controller)

Next, the controller 28 will be described in detail. In the controller 28, the control circuit 35 mounted on the IC board 36 is electrically connected to the common terminal 51 (the common electrode) and the individual terminals 53 (the individual electrodes) of the actuator plate 40 via the flexible board 37.

Figure 5:
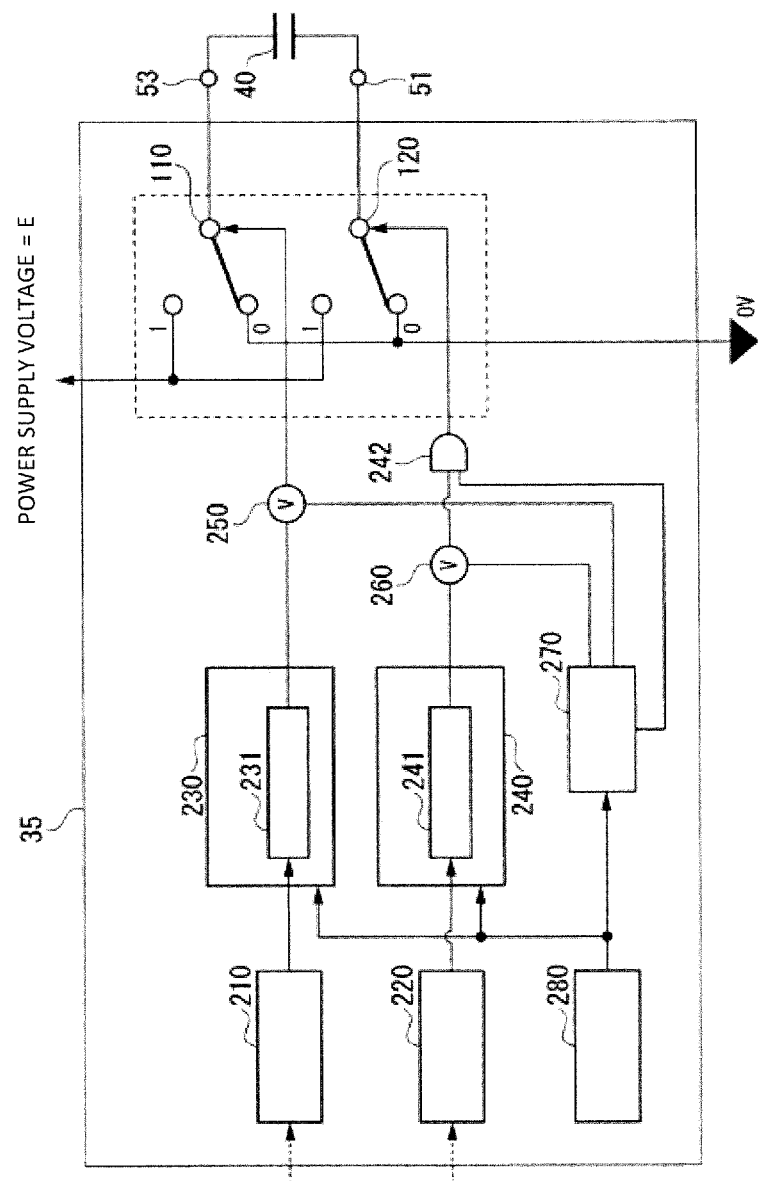
FIG. 5 is a schematic block diagram showing an example of a control circuit in the embodiment of the invention.

FIG. 5 is a schematic block diagram showing an example of the control circuit 35 in the present embodiment. As shown in the drawing, the control circuit 35 is provided with a first switch 110, a second switch 120, a first waveform memory 210, a second waveform memory 220, a first waveform generator 230 (a first waveform generation section), a second waveform generator 240 (a second waveform generation section), an AND circuit 242, a first voltmeter 250 (a detection section), a second voltmeter 260 (a detection section), a comparator 270 (a control section), and a clock generator 280, and applies the drive voltage to the common terminal 51 (the common electrode) and the individual terminals 53 (the individual electrodes) of the actuator plate 40. Here, the actuator plate 40 is the PZT (piezoelectric) ceramics substrate as described above, and is a capacitive load to the control circuit 35.

As shown in the drawing, the first switch 110 and the second switch 120 are configured as a full-bridge pulse drive circuit for driving the actuator plate 40. The first switch 110 is a switch having an output terminal connected to the individual terminal 53, and switching the output to the output terminal between the power supply ("1") and the ground ("0"). The first switch 110 switches the output to the output terminal to the power supply in the case in which the voltage of the drive waveform output by the first waveform generator 230 is in the high level, and switches the output to the output terminal to the ground in the case in which the voltage of the drive waveform output by the first waveform generator 230 is in the low level.

The second switch 120 is a switch having an output terminal connected to the common terminal 51, and switching the output to the output terminal between the power supply ("1") and the ground ("0"). The second switch 120 switches the output to the output terminal to the power supply in the case in which the voltage of the drive waveform output by the second waveform generator 240 is in the high level, and switches the output to the output terminal to the ground in the case in which the voltage of the drive waveform output by the second waveform generator 240 is in the low level. The actuator plate 40 is driven by the drive voltages from the first switch 110 and the second switch 120.

It should be noted that normally the actuator plate 40 is always connected to the ground on the common electrode side, and is driven by the drive voltage E applied to the individual electrode side. Therefore, the maximum rating of the circuit is set to a level slightly higher than the voltage E. However, in the present embodiment, as described above, the drive voltage is applied also to the common electrode side in addition to the individual electrode side. In other words, the control circuit 35 also drives (common-drives) the common electrode side of the actuator plate 40 (the PZT ceramics substrate) by switching the output of the second switch 120. Therefore, depending on the drive timing of the first switch 110 and the second switch 120, the voltage 2E exceeding the maximum rating is applied to the circuit in some cases, and thus the circuit breaks down due to the overvoltage in some cases.

FIGS. 6A through 6E are diagrams showing an example of a normal drive pattern of the first switch and the second switch. The present diagrams show the normal drive pattern in which the overvoltage does not occur. Here, the power supply voltage is "E" (volt).

Firstly, in the initial state shown in FIG. 6A, the outputs of the first switch 110 and the second switch 120 are both at the ground "0." At this moment, the charge voltage of the actuator plate 40 is "0" V, and the generation voltage generated in the circuit is "0" V.

Subsequently, when charging shown in FIG. 6B is set, the output of the first switch 110 is switched to the power supply "1." In contrast, the second switch 120 remains fixed to "0." Then, when charging is completed, the charge voltage of the actuator plate 40 turns to "E" V, and the generation voltage turns to "E" V.

Subsequently, when the initial state shown in FIG. 6C is set, both of the first switch 110 and the second switch 120 are switched to "0." Then, when discharging is completed, the charge voltage of the actuator plate 40 turns to "0" V, and the generation voltage turns to "0" V.

Subsequently, when reverse charging shown in FIG. 6D is set, the output of the second switch 120 is switched to the power supply "1." In contrast, the first switch 110 remains fixed to "0." Then, when charging is completed, the charge voltage of the actuator plate 40 turns to "E" V, and the generation voltage turns to "−E" V.

Subsequently, when discharging shown in FIG. 6E is set, both of the first switch 110 and the second switch 120 are switched to "0." Then, when discharging is completed, the charge voltage of the actuator plate 40 turns to "0" V, and the generation voltage turns to "0" V.

As described above, in the normal operation, the first switch 110 and the second switch 120 act so that the generation voltage does not exceed the power supply voltage "E" V.

In contrast, FIGS. 7A through 7C are diagrams showing an example of an abnormal drive pattern of the first switch 110 and the second switch 120. The present diagrams show the abnormal drive pattern in which the overvoltage occurs.

Firstly, in the discharging state shown in FIG. 7A, the first switch 110 and the second switch 120 are both at "0." At this moment, the charge voltage of the actuator plate 40 is "0" V, and the generation voltage is "0" V.

Subsequently, when charging shown in FIG. 7B is set, the first switch 110 is switched to "1." In contrast, the second switch 120 remains fixed to "0." Then, when charging is completed, the charge voltage of the actuator plate 40 turns to "E" V, and the generation voltage turns to "E" V.

Subsequently, when additional charging shown in FIG. 7C is set, the second switch 120 is switched to "1." In contrast, the first switch 110 remains fixed to "1." In this state, since the charge voltage of the actuator plate 40 is "E" V, the generation voltage becomes "2E" V to exceed the power supply voltage "E" V.

As described above, when the first switch 110 is set to "1," if the second switch 120 at the lower potential is switched from "0" to "1" in the state in which the charge is accumulated in the actuator plate 40, a potential twice as high as the power supply voltage is applied to the first switch 110, and there is a possibility of breaking down the circuit.

Normally, the control circuit 35 makes the first waveform generator 230 and the second waveform generator 240 output the drive waveforms so that the first switch 110 and the second switch 120 act in the normal drive pattern. However, by wrong data being written to the first waveform memory 210 or the second waveform memory 220, or the waveform data being rewritten due to an influence of noise or the like, the drive waveforms output from the first waveform generator 230 and the second waveform generator 240 are replaced with unexpected waveforms in some cases. In such a case, the drive waveforms output from the first waveform generator 230 and the second waveform generator 240 make the first switch 110 and the second switch 120 act in the abnormal drive pattern in some cases.

It should be noted that the first waveform memory 210 is a memory for storing the waveform data related to the drive waveform output by the first waveform generator 230. The second waveform memory 220 is a memory for storing the waveform data related to the drive waveform output by the second waveform generator 240. The first waveform memory 210 and the second waveform memory 220 are each an externally writable memory. Further, the clock generator 280 oscillates a clock signal to be the reference for generating the drive waveform, and then outputs the clock signal thus oscillated to the first waveform generator 230, the second waveform generator 240, and the comparator 270.

Further, the first waveform generator 230 is provided with a waveform generation circuit 231, and outputs the drive waveform for driving the first switch 110 based on the clock signal input from the clock generator 280. The waveform generation circuit 231 reads out the waveform data from the first waveform memory 210, and then outputs the drive waveform for driving the first switch 110 based on the waveform data thus read out.

The second waveform generator 240 is provided with a waveform generation circuit 241, and outputs the drive waveform for driving the second switch 120 based on the clock signal input from the clock generator 280. The waveform generation circuit 241 reads out the waveform data from the second waveform memory 220, and then outputs the drive waveform for driving the second switch 120 based on the waveform data thus read out.

FIGS. 8A through 8E are diagrams each showing an example of drive waveforms output by the first waveform generator 230 and the second waveform generator 240.

In the present diagrams, the horizontal axis represents time. Further, the upper part shows the drive waveform A output by the first waveform generator 230, and the lower part shows the drive waveform B output by the second waveform generator 240.

Figure 8A:
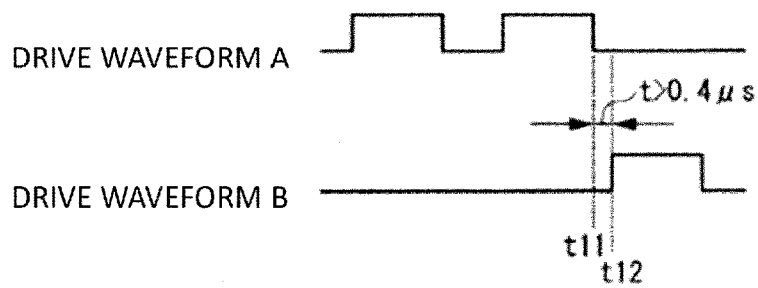
FIGS. 8A through 8E are diagrams showing an example of drive waveforms output by a first waveform generator and a second waveform generator in the embodiment of the invention.
Figure 8B:
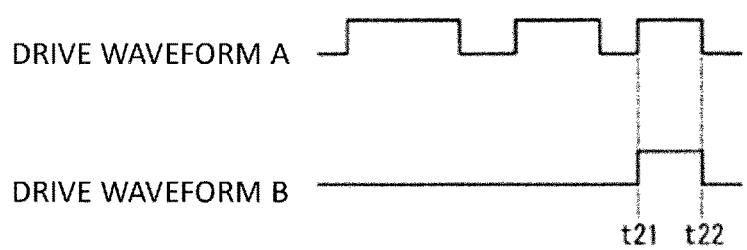

FIG. 8A and FIG. 8B each show an example of the drive waveform for making the first switch 110 and the second switch 120 act in the normal drive pattern. In the example shown in FIG. 8A, the voltage of the drive waveform B is switched (t12) from the low level to the high level after time equal to or longer than the electrical discharge time constant (e.g., 0.4 μs (microsecond)) of the actuator plate 40 has elapsed from when the voltage of the drive waveform A has been switched (t11) from the high level to the low level.

In the example shown in FIG. 8B, the voltage of the drive waveform A and the voltage of the drive waveform B are switched (t21) at the same time from the low level to the high level, and then, the voltage of the drive waveform A and the voltage of the drive waveform B are switched (t22) at the same time from the high level to the low level.

Figure 8C:
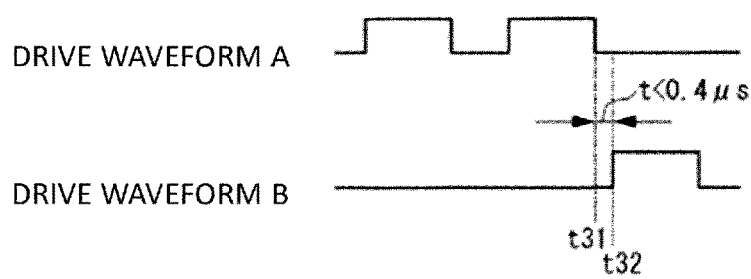
Figure 8D:
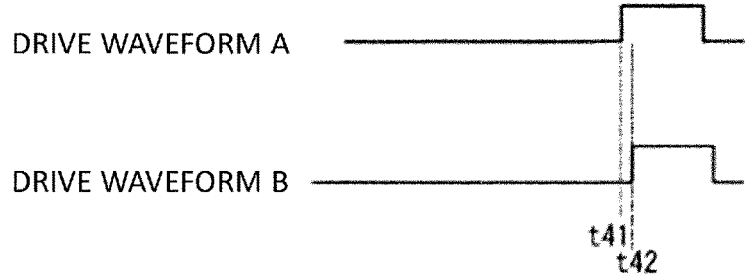
Figure 8E:
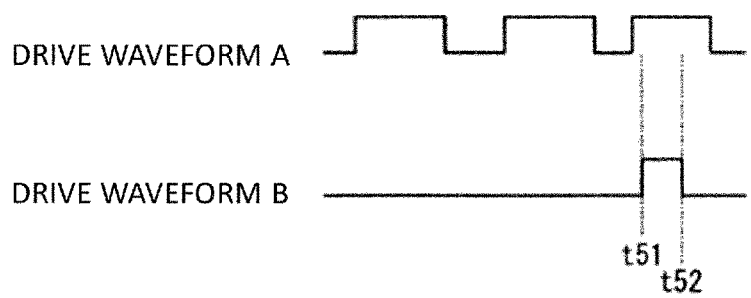

In contrast, FIG. 8C through FIG. 8E each show a forbidden waveform, which makes the first switch 110 and the second switch 120 act in the abnormal drive pattern. In the example shown in FIG. 8C, the voltage of the drive waveform B is switched (t32) from the low level to the high level before the time equal to or longer than the electrical discharge time constant of the actuator plate 40 elapses from when the voltage of the drive waveform A has been switched (t31) from the high level to the low level. In such a case, in the actuator plate 40, the charge is accumulated due to charging on the common electrode (the drive waveform B) side in the state in which the charge having been charged on the individual electrode (the drive waveform A) side has not completely been discharged, and the overvoltage is applied to the circuit in some cases. Therefore, in the case of the forbidden waveform with which the voltage of the drive waveform B is switched from the low level to the high level before the time equal to or longer than the electrical discharge time constant elapses from when the voltage of the drive waveform A has been switched from the high level to the low level, the second switch 120 acts in the abnormal drive pattern of being switched from "0" to "1" before the time equal to or longer than the electrical discharge time constant elapses from when the first switch 110 has been switched from "1" to "0."

Further, in the example shown in FIG. 8D, the drive waveform B is switched (t42) from the low level to the high level immediately after the drive waveform A has been switched (t41) from the low level to the high level. Further, in the example shown in FIG. 8E, the drive waveform B is switched (t51) from the low level to the high level, and is then switched (t52) from the high level to the low level during the period in which the drive waveform A is in the high level.

In the case of the forbidden waveform with which the voltage of the drive waveform B is switched from the low level to the high level during the period in which the voltage of the drive waveform A is in the high level, the second switch 120 acts in the abnormal drive pattern of being switched from "0" to "1" during the period in which the first switch 110 is in "1."

In order to prevent the first switch 110 and the second switch 120 from acting in the abnormal drive patterns, the comparator 270 compares the voltage of the drive waveform A detected by the first voltmeter 250 and the voltage of the drive waveform B detected by the second voltmeter 260 with each other, and controls the voltage of the drive waveform B, which is output from the second waveform generator 240, to the low level so as to set the output of the second switch 120 to the ground in the case in which the drive waveforms output from the first waveform generator 230 and the second waveform generator 240 are the forbidden waveforms.

Here, the first voltmeter 250 detects the voltage of the drive waveform output by the first waveform generator 230. Further, the second voltmeter 260 detects the voltage of the drive waveform output by the second waveform generator 240. The first voltmeter 250 and the second voltmeter 260 constitute the detection section for detecting the voltages of the drive waveforms output by the first waveform generator 230 and the second waveform generator 240.

Specifically, the comparator 270 obtains the voltages detected by the first voltmeter 250 and the second voltmeter 260 based on the clock signal input from the clock generator 280. Then, the comparator 270 controls either of the outputs of the first switch 110 and the second switch 120 based on the voltages thus obtained. For example, the comparator 270 carries out the control so that either one of the outputs of the first switch 110 and the second switch 120 becomes at the ground based on the voltages detected by the first voltmeter 250 and the second voltmeter 260. More specifically, in the case in which it is detected that the voltage of the drive waveform output by the first waveform generator 230 is in the high level, and the voltage of the drive waveform output by the second waveform generator 240 has been switched from the low level to the high level, the comparator 270 controls the control signal to be output to the AND circuit 242 to the low level so that the output of the second switch 120 becomes at the ground to thereby control the second waveform generator 240.

In the AND circuit 242, the control signal from the comparator 270 is input to a first input terminal, the drive waveform output from the second waveform generator 240 is input to a second input terminal, and the drive waveform for driving the second switch 120 is output from an output terminal. In other words, the AND circuit 242 fixes the voltage of the drive waveform for driving the second switch 120 to the low level so that the output of the second switch 120 becomes at the ground based on the control signal. Specifically, in the case in which the control signal is in the low level, the AND circuit 242 outputs the drive waveform with the voltage in the low level to the second switch 120. Further, in the case in which the control signal is in the high level, the AND circuit 242 outputs the drive waveform, which is output from the second waveform generator 240, to the second switch 120.

Further, the comparator 270 carries out the control so as to hold (fix) the output state (output) of the second switch 120 thus controlled at the ground until a predetermined condition is fulfilled. Then, if the predetermined condition is fulfilled, the comparator 270 releases the control (fixation) of the output of the second switch 120. Specifically, in the case in which the comparator 270 fixes the output of the second switch 120 at the ground, and then the predetermined condition is fulfilled, the comparator 270 controls the control signal to be output to the AND circuit 242 from the low level to the high level to thereby release the fixation of the second switch 120. As the predetermined condition, there can be cited, for example, a condition that a predetermined time has elapsed from when fixing the voltage of the drive waveform output by the second waveform generator 240 to the low level, a condition that the number of times of printing has become equal to or larger than a predetermined number of times, a condition that the liquid jet recording device 1 has been powered on, and a condition that an operation input has been received from a user.

Figure 9:
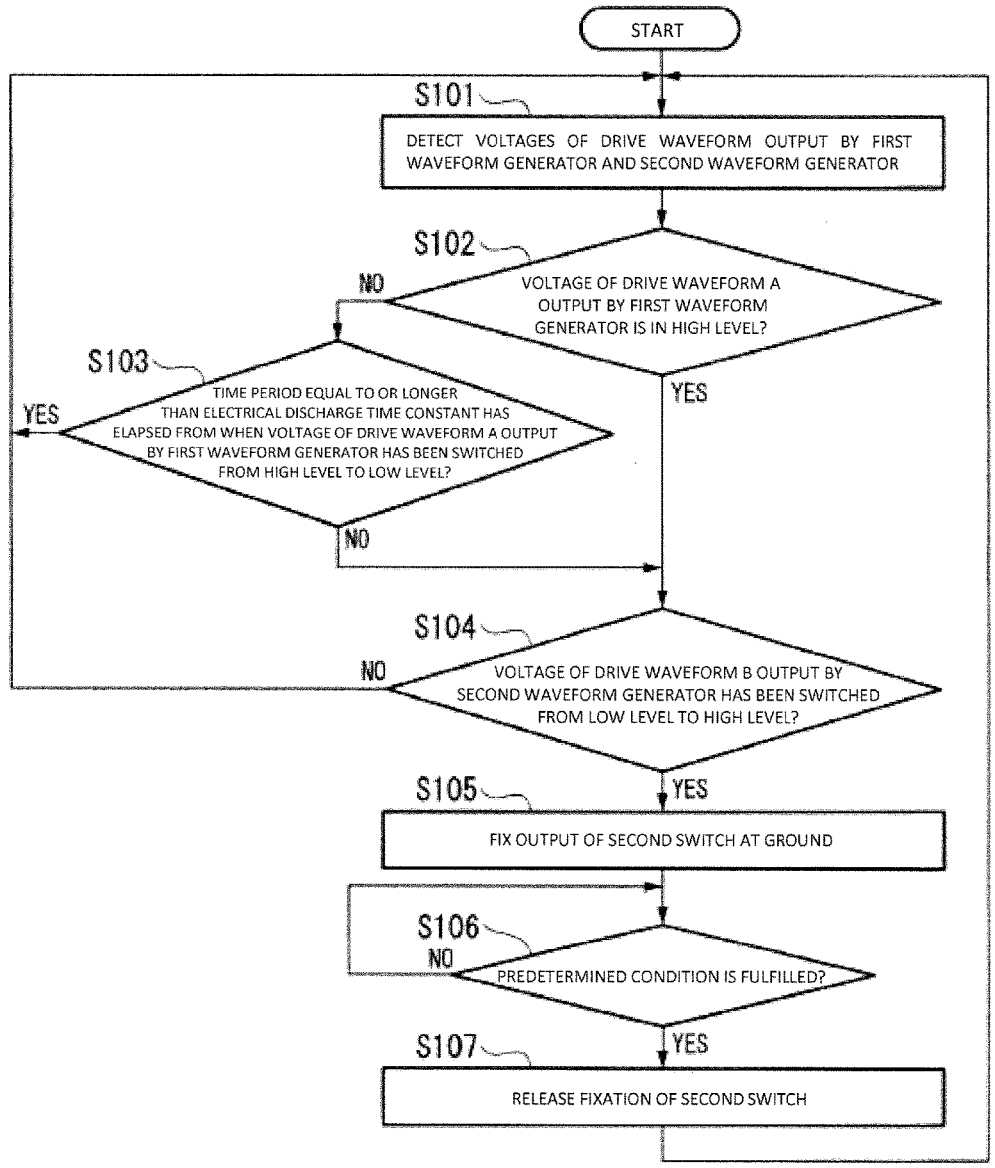
FIG. 9 is a flowchart showing an example of a switch control process in the embodiment of the invention.

Then, the operation of the switch control process executed by the control circuit 35 will be described with reference to FIG. 9. FIG. 9 is a flowchart showing an example of the switch control process. Here, the switch control process denotes a process of controlling the output of the second switch 120 based on the voltage of the drive waveform A and the voltage of the drive waveform B as described above.

(Step S101) The first voltmeter 250 detects the voltage of the drive waveform A output by the first waveform generator 230. Further, the second voltmeter 260 detects the voltage of the drive waveform B output by the second waveform generator 240. Subsequently, the process proceeds to the process in the step S102.

(Step S102) The comparator 270 determines whether or not the voltage (the voltage of the drive waveform A output by the first waveform generator 230) detected by the first voltmeter 250 is in the high level. In the case in which the comparator 270 has determined that the voltage is in the high level, the process proceeds to the process in the step S104. Further, in the case in which the comparator 270 has determined that the voltage is in the low level, the process proceeds to the process in the step S103.

(Step S103) The comparator 270 determines whether or not the time equal to or longer than the electrical discharge time constant has elapsed from when the voltage (the voltage of the drive waveform A output by the first waveform generator 230) detected by the first voltmeter 250 has been switched from the high level to the low level. In the case in which the comparator 270 has determined that the time equal to or longer than the electrical discharge time constant has elapsed, the process returns to the process in the step S101. Further, in the case in which the comparator 270 has determined that the time equal to or longer than the electrical discharge time constant has not elapsed, the process proceeds to the process in the step S104.

(Step S104) The comparator 270 determines whether or not the voltage (the voltage of the drive waveform B output by the second waveform generator 240) detected by the second voltmeter 260 has been switched from the low level to the high level. In the case in which the comparator 270 has determined that the voltage has been switched from the low level to the high level, the process proceeds to the process in the step S105. Further, in the case in which the comparator 270 has determined that the voltage has not been switched from the low level to the high level, the process returns to the process in the step S101.

(Step S105) The comparator 270 controls the control signal to be output to the AND circuit 242 to the low level to thereby control the voltage of the drive waveform output from the second waveform generator 240 to the low level, and thus, fixes the output of the second switch 120 at the ground. Subsequently, the process proceeds to the process in the step S106.

(Step S106) The comparator 270 determines whether or not the predetermined condition has been fulfilled. In the case in which the comparator 270 has determined that the predetermined condition has been fulfilled, the process proceeds to the process in the step S107. Further, in the case in which the comparator 270 has determined that the predetermined condition has not been fulfilled, the process in the step S106 is executed once again.

(Step S107) The comparator 270 controls the control signal to be output to the AND circuit 242 from the low level to the high level to release the fixation of the second switch 120 to the ground. Subsequently, the process returns to the process in the step S101.

As described hereinabove, the control circuit 35 according to the present embodiment is a full-bridge circuit provided with the first switch 110, the second switch 120, the first waveform generator 230, the second waveform generator 240, the first voltmeter 250, the second voltmeter 260, the comparator 270, and the AND circuit 242, wherein the output terminal of the first switch 110 is connected to the individual terminal 53, the first switch 110 switches the output to the output terminal between the power supply and the ground, the output terminal of the second switch 120 is connected to the common terminal 51, the second switch 120 switches the output to the output terminal between the power supply and the ground, the first waveform generator 230 outputs the drive waveform for driving the first switch 110, the second waveform generator 240 outputs the drive waveform for driving the second switch 120, the first voltmeter 250 detects the voltage of the drive waveform output by the first waveform generator 230, the second voltmeter 260 detects the voltage of the drive waveform output by the second waveform generator 240, the comparator 270 controls the output of the second switch 120 to be at the ground based on the voltages detected by the first voltmeter 250 and the second voltmeter 260, and the AND circuit 242 fixes the voltage of the drive waveform output by the second waveform generator 240 to the low level. The first switch 110 switches the output to the output terminal to the power supply in the case in which the voltage of the drive waveform output by the first waveform generator 230 is in the high level, and switches the output to the output terminal to the ground in the case in which the voltage of the drive waveform output by the first waveform generator 230 is in the low level. The second switch 120 switches the output to the output terminal to the power supply in the case in which the voltage of the drive waveform output by the second waveform generator 240 is in the high level, and switches the output to the output terminal to the ground in the case in which the voltage of the drive waveform output by the second waveform generator 240 is in the low level. To the first input terminal of the AND circuit 242, there is input the control signal from the comparator 270. In the case in which the comparator 270 has detected that the voltage of the drive waveform output by the first waveform generator 230 is in the high level, or the time equal to or longer than the electrical discharge time constant has not elapsed from when the voltage of the drive waveform output by the first waveform generator 230 has been switched from the high level to the low level, and the voltage of the drive waveform output by the second waveform generator 240 has been switched from the low level to the high level, the comparator 270 controls the control signal to be output to the AND circuit 242 to the low level so that the output of the second switch 120 becomes at the ground.

Thus, it is possible to prevent the first switch 110 and the second switch 120 from acting in the abnormal drive patterns due to the influence of the noise or the like to thereby prevent the overvoltage from being applied to the circuit. Therefore, it is possible to prevent the breakdown due to the occurrence of the voltage exceeding the absolute maximum rating of the circuit.

Although the embodiment of the invention is hereinabove described, the present invention is not limited to the embodiment described above, but a variety of modifications can be made within the scope or the spirit of the invention.

For example, although in the embodiment described above, there is described the full-bridge circuit used in the control circuit 35 of each of the liquid jet heads 4 of the liquid jet recording device 1, the full-bridge circuit according to the present embodiment can also be applied to a device other than the liquid jet recording device 1.

Further, although in the embodiment described above, the output of the second switch 120 having the output terminal to be connected to the common terminal 51 is fixed at the ground to prevent the abnormal operation, the invention is not limited to this configuration, but it is also possible to prevent the abnormal operation by fixing the output of the first switch 110 at the ground. For example, it is also possible for the comparator 270 to control the output of the first switch 110 to be at the ground in the case in which the comparator 270 has detected that the voltage of the drive waveform output by the second waveform generator 240 is in the high level, or the time equal to or longer than the electrical discharge time constant has not elapsed from when the voltage of the drive waveform output by the second waveform generator 240 has been switched from the high level to the low level, and the voltage of the drive waveform output by the first waveform generator 230 has been switched from the low level to the high level.

Further, it is not necessary for the comparator 270 to consider the condition on whether or not the time equal to or longer than the electrical discharge time constant elapses as the condition for controlling the output of the second switch 120 or the first switch 110 to become at the ground. For example, in the case in which the comparator 270 has detected that the voltage of the drive waveform output by the second waveform generator 240 has been switched from the low level to the high level before the time equal to or longer than the electrical discharge time constant elapses from when the voltage of the drive waveform output by the first waveform generator 230 has been switched from the high level to the low level (the example of the drive waveform shown in FIG. 8C), it is also possible for the comparator 270 to carry out the control so that the drive waveform output by the second waveform generator 240 is input to the second switch 120 on the assumption that the operation is normal. Further, similarly, in the case in which the comparator 270 has detected that the voltage of the drive waveform output by the first waveform generator 230 has been switched from the low level to the high level before the time equal to or longer than the electrical discharge time constant elapses from when the voltage of the drive waveform output by the second waveform generator 240 has been switched from the high level to the low level, it is also possible for the comparator 270 to carry out the control so that the drive waveform output by the first waveform generator 230 is input to the first switch 110 on the assumption that the operation is normal.

Further, it is possible to adopt driving with the drive waveform obtained by reversing the level of the drive waveform shown in FIGS. 8A through 8E between the high level and the low level. In this case, in the case in which the output of one of the first switch 110 and the second switch 120 is at the ground, and the output of the other has been switched from the power supply to the ground, the overvoltage −2E occurs in the circuit in some cases. In such a case, it is possible to prevent the overvoltage by fixing the output from the other of the switches to the power supply. Specifically, in the case in which the comparator 270 has detected that the voltage of the drive waveform output by the first waveform generator 230 is in the low level, or the time equal to or longer than the electrical discharge time constant has not elapsed from when the voltage of the drive waveform output by the first waveform generator 230 has been switched from the low level to the high level, and the voltage of the drive waveform output by the second waveform generator 240 has been switched from the high level to the low level, the comparator 270 controls the output of the second switch 120 to be at the power supply. In this case, for example, by providing an OR circuit instead of the AND circuit 242, and the comparator 270 controlling the control signal to be output to the OR circuit to the high level, the output of the second switch 120 is controlled to be at the power supply. It should be noted that it is also possible for the comparator 270 to control the output of the first switch 110 to be at the power supply in the case in which the comparator 270 has detected that the voltage of the drive waveform output by the second waveform generator 240 is in the low level, or the time equal to or longer than the electrical discharge time constant has not elapsed from when the voltage of the drive waveform output by the second waveform generator 240 has been switched from the low level to the high level, and the voltage of the drive waveform output by the first waveform generator 230 has been switched from the high level to the low level.

It should be noted that it is also possible to realize the whole or a part of the function of each of the sections provided to the control circuit 35 in the embodiment described above by recording the program for realizing the functions on a computer-readable recording medium, and then making the computer system retrieve and then execute the program recorded on the recording medium. It should be noted that the "computer system" mentioned here should include an OS and the hardware such as peripheral devices.

Further, the "computer-readable recording medium" denotes a portable recording medium such as a flexible disk, a magneto-optical disk, a ROM, and a CD-ROM, and a storage section such as a hard disk incorporated in the computer system. Further, the "computer-readable recording medium" can include those dynamically holding a program for a short period of time such as a communication line in the case of transmitting the program via a network such as the Internet or a communication line such as a telephone line, and those holding a program for a certain period of time such as a volatile memory in a computer system functioning as a server or a client in that occasion. Further, the program described above can be those for partially realizing the functions described above, or those capable of realizing the functions described above in combination with a program having already been recorded on the computer system.

Further, the control circuit 35 in the embodiment described above can also be realized as an integrated circuit such as an LSI (Large Scale Integration). Further, for example, the control circuit 35 can also be integrated as a processor. Further, the method of the circuit integration is not limited to LSI, but the circuit can be realized by a dedicated circuit or a general-purpose processor. Further, in the case in which a technology of the circuit integration replacing the LSI appears due to the advance in semiconductor technology, it is also possible to use an integrated circuit derived from such a technology.

What is claimed is:

1. A full-bridge circuit comprising:
   a first switch having an output terminal connected to one end of a capacitive load, and switching output to the output terminal between a power supply and a ground;
   a second switch having an output terminal connected to the other end of the capacitive load, and switching output to the output terminal between the power supply and the ground;
   a first waveform generation section adapted to output a drive waveform for driving the first switch;
   a second waveform generation section adapted to output a drive waveform for driving the second switch;
   a detection section adapted to detect voltages of the drive waveforms output by the first waveform generation section and the second waveform generation section; and
   a control section adapted to control the output of either of the first switch or the second switch, based on the voltages detected by the detection section.

2. The full-bridge circuit according to claim 1, wherein the control section controls the output of either of the first switch or the second switch to be at the ground, based on the voltages detected by the detection section.

3. The full-bridge circuit according to claim 2, wherein the first switch switches the output to the output terminal to the power supply in a case in which the voltage of the drive waveform output by the first waveform generation section is in a high level, and switches the output to the output terminal to the ground in a case in which the voltage of the drive waveform output by the first waveform generation section is in a low level,
the second switch switches the output to the output terminal to the power supply in a case in which the voltage of the drive waveform output by the second waveform generation section is in the high level, and switches the output to the output terminal to the ground in a case in which the voltage of the drive waveform output by the second waveform generation section is in the low level, and
the control section controls the output of the second switch to be at the ground in a case in which the detection section has detected that the voltage of the drive waveform output by the first waveform generation section is in the high level and that the voltage of the drive waveform output by the second waveform generation section has been switched from the low level to the high level.

4. The full-bridge circuit according to claim 3, wherein the control section controls the output of the second switch to be at the ground in a case in which the detection section has detected that the voltage of the drive waveform output by the second waveform generation section has been switched from the low level to the high level before time period of equal to or longer than an electrical discharge time constant of the capacitive load elapses from when the voltage of the drive waveform output by the first waveform generation section has been switched from the high level to the low level.

5. The full-bridge circuit according to claim 4, further comprising:
an AND circuit adapted to fix the voltage of the drive waveform output by the second waveform generation section to the low level,
wherein a control signal from the control section is input to a first input terminal of the AND circuit, and
the control section controls the output of the second switch to be at the ground by controlling the control signal to be the low level.

6. The full-bridge circuit according to claim 3, further comprising:
an AND circuit adapted to fix the voltage of the drive waveform output by the second waveform generation section to the low level,
wherein a control signal from the control section is input to a first input terminal of the AND circuit, and
the control section controls the output of the second switch to be at the ground by controlling the control signal to be the low level.

7. The full-bridge circuit according to claim 1, wherein the control section controls the output of either of the first switch or the second switch to be at the power supply, based on the voltages detected by the detection section.

8. The full-bridge circuit according to claim 7, wherein the first switch switches the output to the output terminal to the power supply in a case in which the voltage of the drive waveform output by the first waveform generation section is in a high level, and switches the output to the output terminal to the ground in a case in which the voltage of the drive waveform output by the first waveform generation section is in a low level,
the second switch switches the output to the output terminal to the power supply in a case in which the voltage of the drive waveform output by the second waveform generation section is in the high level, and switches the output to the output terminal to the ground in a case in which the voltage of the drive waveform output by the second waveform generation section is in the low level, and
the control section controls the output of the second switch to be at the power supply in a case in which the detection section has detected that the voltage of the drive waveform output by the first waveform generation section is in the low level and that the voltage of the drive waveform output by the second waveform generation section has been switched from the high level to the low level.

9. The full-bridge circuit according to claim 8, wherein the control section controls the output of the second switch to be at the power supply in a case in which the detection section has detected that the voltage of the drive waveform output by the second waveform generation section has been switched from the high level to the low level before time period of equal to or longer than an electrical discharge time constant of the capacitive load elapses from when the voltage of the drive waveform output by the first waveform generation section has been switched from the low level to the high level.

10. The full-bridge circuit according to claim 9, further comprising:
an OR circuit adapted to fix the voltage of the drive waveform output by the second waveform generation section to the power supply,
wherein a control signal from the control section is input to a first input terminal of the OR circuit, and
the control section controls the output of the second switch to be at the power supply by controlling the control signal to be the high level.

11. The full-bridge circuit according to claim 8, further comprising:
an OR circuit adapted to fix the voltage of the drive waveform output by the second waveform generation section to the power supply,
wherein a control signal from the control section is input to a first input terminal of the OR circuit, and
the control section controls the output of the second switch to be at the power supply by controlling the control signal to be the high level.

12. The full-bridge circuit according to claim 1, wherein the control section controls the output of the first switch or the second switch which has been controlled so as to be held until a predetermined condition is fulfilled, and releases the control of the output thereof when the predetermined condition is fulfilled.

13. A liquid jet head comprising:
the full-bridge circuit according to claim 1; and
an actuator plate which is the capacitive load driven by the full-bridge circuit.

14. A liquid jet recording device comprising:
the liquid jet head according to claim 13.

* * * * *